(12) United States Patent
Kawai

(10) Patent No.: US 10,879,145 B2
(45) Date of Patent: Dec. 29, 2020

(54) ELECTRONIC DEVICE AND METHOD OF MANUFACTURE THEREFOR

(71) Applicant: OMRON Corporation, Kyoto (JP)

(72) Inventor: Wakahiro Kawai, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/334,036

(22) PCT Filed: Sep. 19, 2017

(86) PCT No.: PCT/JP2017/033681
§ 371 (c)(1),
(2) Date: Mar. 18, 2019

(87) PCT Pub. No.: WO2018/070192
PCT Pub. Date: Apr. 19, 2018

(65) Prior Publication Data
US 2019/0259679 A1    Aug. 22, 2019

(30) Foreign Application Priority Data

Oct. 14, 2016 (JP) .................. 2016-202796

(51) Int. Cl.
*H01L 23/48* (2006.01)
*H01L 23/31* (2006.01)
(Continued)

(52) U.S. Cl.
CPC ......... *H01L 23/3135* (2013.01); *H01B 5/14* (2013.01); *H01B 13/00* (2013.01);
(Continued)

(58) Field of Classification Search
CPC ........... H01L 23/3135; H01L 23/49861; H01L 23/49866; H01L 21/565; H01B 5/14; H05K 1/0201
(Continued)

(56) References Cited

U.S. PATENT DOCUMENTS 5,157,475 A * 10/1992 Yamaguchi ............. H01L 21/56
257/679
5,157,480 A * 10/1992 McShane .......... H01L 23/49517
174/529

(Continued)

FOREIGN PATENT DOCUMENTS

EP          2477466 A2     7/2012
JP       H11-121644 A      4/1999
(Continued)

OTHER PUBLICATIONS

The extended European search report dated Dec. 10, 2019 in a related European patent application.
(Continued)

*Primary Examiner* — Nitin Parekh
(74) *Attorney, Agent, or Firm* — Metrolex IP Law Group, PLLC

(57) ABSTRACT

An electronic device includes electronic components, a molded resin element wherein the electronic components are embedded and secured, and a heat transfer layer; the heat transfer layer has a higher thermal conductivity than the molded resin element. The heat transfer layer is in contact with portions of the electronic components other than an electrode pad and a terminal. This prevents increases in the cost of manufacturing the electronic device and the allows the electronic device to be thinner.

1 Claim, 7 Drawing Sheets

(51) Int. Cl.
*H01L 21/48* (2006.01)
*H01L 21/56* (2006.01)
*H01L 23/498* (2006.01)
*H05K 1/02* (2006.01)
*H05K 3/00* (2006.01)
*H01B 5/14* (2006.01)
*H01B 13/00* (2006.01)
*H05K 7/20* (2006.01)
*H01L 23/29* (2006.01)

(52) U.S. Cl.
CPC ........ *H01L 21/4867* (2013.01); *H01L 21/565* (2013.01); *H01L 23/49838* (2013.01); *H05K 1/02* (2013.01); *H05K 3/00* (2013.01); *H05K 7/20* (2013.01); *H01L 23/293* (2013.01); *H01L 23/49866* (2013.01)

(58) Field of Classification Search
USPC .................................. 257/666, 706, 713, 787
See application file for complete search history.

(56) References Cited

U.S. PATENT DOCUMENTS

| | | | | |
|---|---|---|---|---|
| 5,625,222 A * | 4/1997 | Yoneda | ................... | H01L 23/24 257/687 |
| 5,976,912 A * | 11/1999 | Fukutomi | ............. | H01L 21/561 438/110 |
| 6,001,671 A * | 12/1999 | Fjelstad | ............. | H01L 21/4832 257/E21.502 |
| 6,163,069 A | 12/2000 | Oohira et al. | | |
| 6,362,436 B1 * | 3/2002 | Kimbara | ............. | H05K 3/3436 174/260 |
| 6,424,025 B1 * | 7/2002 | Liu | ..................... | H01L 23/3121 257/666 |
| 7,816,769 B2 * | 10/2010 | Lam | ...................... | H01L 21/561 257/666 |
| 7,825,498 B2 * | 11/2010 | Haga | .................. | H01L 23/3677 257/667 |
| 8,334,584 B2 * | 12/2012 | Camacho | .......... | H01L 23/49548 257/676 |
| 2010/0109137 A1 | 5/2010 | Sasaki et al. | | |
| 2013/0113015 A1 | 5/2013 | Kimura et al. | | |
| 2015/0214129 A1 | 7/2015 | Kawakita et al. | | |
| 2016/0159037 A1 | 6/2016 | Sakaguchi et al. | | |
| 2017/0278762 A1 * | 9/2017 | Kessler | ............... | H01L 23/3121 |

FOREIGN PATENT DOCUMENTS

| | | |
|---|---|---|
| JP | H11-163566 A | 6/1999 |
| JP | 2000-151162 A | 5/2000 |
| JP | 2000-340210 A | 12/2000 |
| JP | 2002-111260 A | 4/2002 |
| JP | 2004-134669 A | 4/2004 |
| JP | 2009-224445 A | 10/2009 |
| JP | 2010-109333 A | 5/2010 |
| JP | 2010-272756 A | 12/2010 |
| JP | 2013-101996 A | 5/2013 |
| JP | 2014-127522 A | 7/2014 |
| JP | 2014-187233 A | 10/2014 |
| WO | 2008087475 A1 | 7/2008 |
| WO | 2014/097641 A1 | 6/2014 |

OTHER PUBLICATIONS

An English translation of the International Search Report of PCT/JP2017/033681 dated Dec. 26, 2017.
The Written Opinion of PCT/JP2017/033681 dated Dec. 26, 2017.

* cited by examiner

ELECTRONIC DEVICE AND METHOD OF MANUFACTURE THEREFOR

FIELD

The present invention relates to an electronic device provided with an electronic component and a heat dissipation structure, and a method of manufacturing the electronic device.

BACKGROUND

Electronic components that have a large heating value, such as semiconductors or light emitting elements, require a means for dissipating the heat generated thereby out to the open; this provides for stable operation and long-term reliability of the electronic device.

A heat radiating structure may be provided on the printed substrate carrying the electronic component to allow an electronic device with an electronic component to radiate heat.

For instance, Japanese Patent Publication No. 2002-111260 A (Patent Document 1) describes providing a heat radiation area in the wiring pattern on the printed substrate; here the heat radiating area has an expanded surface area. Japanese Patent Publication No. 2000-151162 A (Patent Document 2) describes placing the lower surface of an electronic component in contact with a metal pattern formed on the printed substrate. Japanese Patent Publication No. 2014-127522 A (Patent Document 3) describes enlarging the heat radiating surface area by providing a conducting pattern or penetrating via on the printed substrate to improve heat dissipation efficiency. Japanese Patent Publication No. 2000-340210 A (Patent Document 4) describes providing a soldered heat radiation bump between the lower surface of the integrated circuit (IC) and a heat radiating electrode on the printed substrate.

FIG. 7 is a cross-sectional view illustrating one example of an electronic device provided with a printed substrate that possesses a heat radiating structure. In addition to the wiring pattern 715 that connects to the electrodes of electronic components 110, 120, the printed substrate 710 is provided with a heat-radiating metal pattern 716, an internally-formed conducting pattern 711, and through via 712, 713, 713 as illustrated in FIG. 7. The printed substrate 710 is also adhered to a radiator plate 700 via a bonding layer 720.

The heat generated by the electronic component 110 travels to the through via 712, 713, 714, the conducting pattern 711, the metal pattern 716, and the radiator plate 700 via the solder 731, 732 and the wiring pattern 715. The heat generated by the electronic component 120 propagates to the metal pattern 716. Thus, heat dissipates from the electronic components 110, 120.

Japanese Patent Publication H11-163566 A (Patent Document 5) and Japanese Patent Publication 2014-187233 A (Patent Document 6) describe methods of providing a heat radiating structure around the electronic component.

FIG. 8 is a cross-sectional view illustrating one example of the electronic device proposed in JP H11-163566 A. The electronic device is provided with a metal heat radiating element 810 that covers the side of the printed substrate 800 whereon the electronic components 110, 120 are mounted as illustrated in FIG. 8. The electronic components 110, 120 and heat radiating element 810 are bonded together via a bonding layer 811.

FIG. 9 is a cross-sectional view illustrating one example of the electronic device proposed in JP 2014-187233 A. As illustrated in FIG. 9, a highly thermally conductive film 930 is adhered via a highly thermally conductive resin sheet 920 to the surface of the printed substrate 800 whereon the electronic components 110, 120 are mounted in the electronic device.

RELATED ART DOCUMENTS

Patent Documents

[Patent Document 1] Japanese Patent Publication No. 2002-111260
[Patent Document 2] Japanese Patent Publication No. 2000-151162
[Patent Document 3] Japanese Patent Publication No. 2014-127522
[Patent Document 4] Japanese Patent Publication No. 2000-340210
[Patent Document 5] Japanese Patent Publication No. H11-163566
[Patent Document 6] Japanese Patent Publication No. 2014-187233

SUMMARY

Technical Problem

Despite this, when an electronic device is configured as illustrated in FIG. 7, the printed substrate 710 is thicker because printed substrate 710 contains the conducting pattern 711 and the through via 712, 713, 714. Thus, it tends to be difficult to provide a thinner electronic device. The cost of producing the electronic device also increases, since the printed substrate 710 has a complicated structure.

It also tends to be difficult to provide thinner versions of the electronic devices illustrated in FIG. 8 and FIG. 9, since the heat radiating element 810 or highly thermally conductive film 930 are adhered via a bonding layer 811 or a highly thermally conductive resin sheet 920 on the electronic components 110, 120. Moreover, manufacturing the electronic device becomes more expensive, since positioning the electronic components 110, 120 and the heat radiating element 810 for bonding, and the bonding step tends to be complicated as illustrated in FIG. 8.

In light of the foregoing problems with the existing technologies, the present invention aims to provide an electronic device and a method of manufacture therefor that prevents increases in the manufacturing cost and allows for manufacturing a thinner electronic device with a heat radiating structure.

Solution to Problem

Provided is an electronic device that includes: an electronic component; a molded resin element with the electronic component embedded and secured therein, and a heat transfer layer; the heat transfer layer has a higher thermal conductivity than the molded resin element.

The outer surface of the electronic component may include an exposed surface that is exposed from the molded resin element; the outer surface of the molded resin element includes a continuous outer surface continuing from the exposed surface; the wiring is formed on the exposed surface and the continuous outer surface to connect to the electrode; and the heat transfer layer is formed on the exposed surface and the continuous outer surface while avoiding the wiring and the electrode. The heat transfer layer may be metal.

The outer surface of the electronic component may include an exposed surface that is exposed from the molded resin element; the outer surface of the molded resin element includes a continuous outer surface continuing from the exposed surface; the wiring is formed on the exposed surface and the continuous outer surface to connect to the electrode; and the heat transfer layer is formed on the exposed surface and the continuous outer surface to cover the wiring. The heat transfer layer may be an electrically insulating element containing graphite.

The outer surface of the electronic component may include a first exposed surface and a second exposed surface exposed from the molded resin element; the outer surface of the molded resin element may include a first continuous outer surface continuing from the first exposed surface and a second continuous outer surface continuing from the second exposed surface; and the heat transfer layer may include a first heat transfer layer formed on the first exposed surface and the first continuous outer surface and a second heat transfer layer formed on the second exposed surface and the second continuous outer surface.

For instance, the first continuous outer surface may face the second continuous outer surface. Alternatively, the first continuous outer surface may be adjacent to the second continuous outer surface.

The heat transfer layer may be embedded and secured in the molded resin element along with the electronic component. In such a case, a portion of the heat transfer layer may be between the molded resin element and the electronic component.

Another aspect of the invention involves pasting an electronic component to a sheet so that a portion of the electronic component including an electrode is touching the sheet; placing the sheet in a mold to create a space between the surface of the sheet on which the electronic component is adhered and the inner surface of the mold and filling the space with resin, to thereby cast a molded resin element with the electronic component embedded therein; separating the sheet from a structural element extracted from the mold and containing the electronic component and the molded resin element thereby exposing a sheet interface that was in contact with the sheet in the structural element; forming wiring configured to connect to the electrode on the sheet interface; and forming a heat transfer layer on the sheet interface to contact the electronic component, the heat transfer layer having higher thermal conductivity than the molded resin element.

The heat transfer layer may be metal, and may be formed on the sheet interface while avoiding the wiring when forming the heat transfer layer.

The heat transfer layer may be an electrically insulating element containing graphite, and formed on the sheet interface to touch the wiring when forming the heat transfer layer.

Another aspect of the present invention involves pasting an electronic component to a sheet so that an electrode is touching the sheet; forming a heat transfer layer on the sheet at least at and around the electronic component; placing the sheet in a mold to create a space between the surface of the sheet on which the electronic component is adhered and the inner surface of the mold and filling the space with resin, to thereby cast a molded resin element with the electronic component and the heat transfer layer embedded therein; separating the sheet from a structural element extracted from the mold and containing the electronic component, the heat transfer layer, and the molded resin element thereby exposing a sheet interface that was in contact with the sheet in the structural element; and forming wiring configured to connect to the electrode on the sheet interface. The heat transfer layer has a higher thermal conductivity than the molded resin element. The wiring and the heat transfer layer may be formed via inkjet printing.

Effects

The present invention prevents increases in manufacturing cost and allows for a thinner electronic device with a heat radiating structure.

DETAILED DESCRIPTION

Figure 1A:
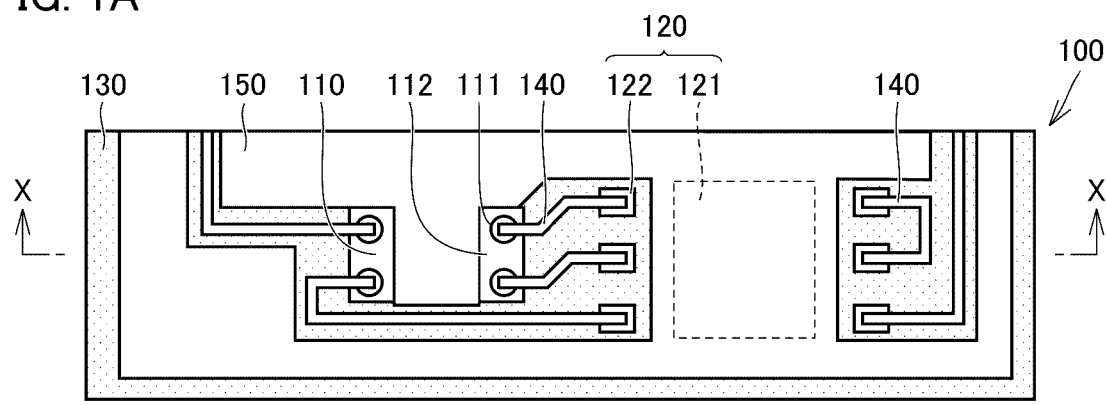
FIG. 1A is a plan view outlining configuration of an electronic device according to a first embodiment.

Embodiments of the present invention are described in detail with reference to the drawings. The same or corresponding elements within the drawings are given the same reference numerals and the explanations therefor will not be repeated.

First Embodiment

Electronic Device Configuration

Figure 1B:
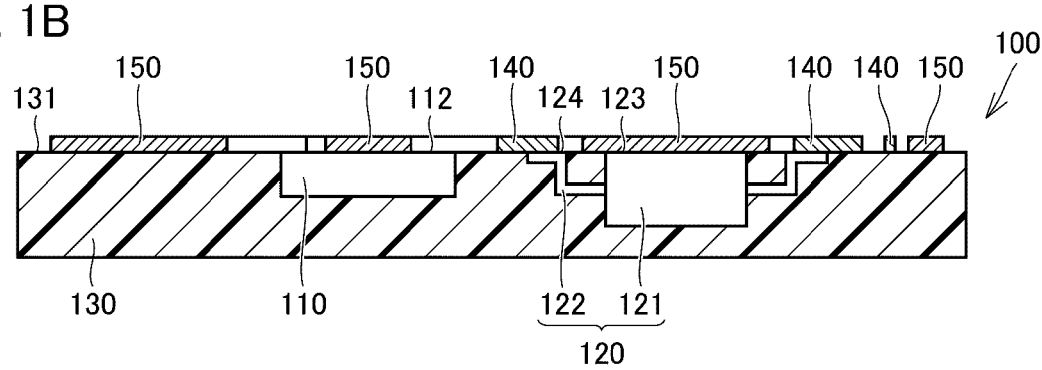
FIG. 1B is a cross-sectional view along the line X-X in FIG. 1A.

FIG. 1A is a plan view illustrating an outline configuration of an electronic device 100 according to a first embodiment; and FIG. 1B is a cross-sectional view along the line X-X in the FIG. 1A.

The electronic device 100 is provided with electronic components 110, 120, a molded resin element 130, wiring 140, and a heat transfer layer 150 as illustrated in FIG. 1A and FIG. 1B.

The electronic components 110, 120 are components that have a large heating value e.g., semiconductor components such as integrated circuits (IC), large-scale integration (LSI), or power transistors; light emitting elements such as a light-emitting diode (LED); passive components such as resistors; and power devices such as batteries.

While the electronic device 100 illustrated in FIG. 1A and FIG. 1B has two electronic components, the number of electronic components is not limited. Other than the electronic components 110, 120 that have a large heating value, the electronic device 100 may also include electronic components with relatively low heating values, such as sensors, or the like.

The electronic component 110 is substantially rectangular and includes a surface 112 whereon an electrode pad 111 is formed.

The electronic component 120 contains a quad flat package (QFP) that has a substantially rectangular main package 121, and a terminal 122 (i.e. an electrode) protruding from the side surface of the main package 121. The end surface 124 of the terminal 122 is flush with one surface 123 of the main package 121.

The molded resin element 130 is a substantially sheet-like resin composed from polycarbonate (PC; with a thermal conductivity of 0.19 W/mK) or acrylonitrile-butadiene-styrene (ABS; with a thermal conductivity of 0.13 W/mK). The shape of the molded resin element 130 is not particularly limited; other types of resins may also be used to formulate the molded resin element 130.

With the electronic components 110, 120 embedded inside the molded resin element 130, the electronic components 110, 120 are secured in the molded resin element 130. However, the surface 112 with the electrode pad 111 on the electronic component 110, and the surface 123 of the main package 121 and the end surface 124 of the terminal 122 on the electronic component 120 are exposed from the upper outer surface 131 of the molded resin element 130. In other words, the surface 112 is an exposed surface that is exposed from the molded resin element 130 at the electronic component 110. The surface 123 and the end surface 124 are similarly exposed surfaces that are exposed from the molded resin element 130 at the electronic component 120.

The upper outer surface 131 of the molded resin element 130, the surface 112 of the electronic component 110, and the surface 123 and end surface 124 of the electronic component 120 are substantially flush. That is, the upper outer surface 131 of the molded resin element 130 is a continuous outer surface that continues from the surface 112 of the electronic component 110 and continues from the surface 123 and the end surface 124 of the electronic component 120.

Referring to two surfaces as continuous, means that a difference in levels between said two surfaces is such that the wiring 140 or the heat transfer layer 150 formed thereon is not disconnected.

The wiring 140 is formed on the upper outer surface 131 of the molded resin element 130, on the surface 112 of the electronic component 110, and the end surface 124 of the terminal 122 for the electronic component 120; the wiring 140 is a conductive circuit for electrically connecting the electrode pad 111 of the electronic component 110 or the terminal 122 of the electronic component 120. The wiring 140 is also electrically connected to outside the electronic device 100. The wiring 140 also provides an external electrical connection for the electronic device 100.

The upper outer surface 131 of the molded resin element 130 is connected to the surface 112 of the electronic component 110 and the end surface 124 of the electronic component 120. Therefore, the wiring 140 may be easily produced by, for instance, using an inkjet printer to print silver ink (Ag).

Inkjet printing refers to ejecting ink from a nozzle to build up ink particles on the surface for printing.

Note that a material other than silver (Ag) may be used for the wiring 140, and other methods may be used to produce the wiring 140; the width or thickness of the wiring is not particularly limited.

The heat transfer layer 150 is made up of a metal with a high thermal conductivity (e.g., silver, with a thermal conductivity of 430 W/mK; or copper, with a thermal conductivity of 400 W/mK) to allow radiation of heat generated by the electronic components 110, 120.

The heat transfer layer 150 is formed as a predetermined pattern with a predetermined thickness (e.g., 1-10 μm) on the upper outer surface 131 of the molded resin element 130, and on the surface 112 and the surface 123 of the electronic components 110 and 120. That is, the heat transfer layer 150 comes in contact with sections other than the electrodes on the electronic components 110, 120 (i.e. the electrode pad 111 and the terminal 122). A portion of the heat transfer layer 150 is formed on the upper outer surface 131 of the molded resin element 130; hereby, heat generated by the electronic components 110 and the electronic component 120 propagates to the heat transfer layer 150 and escapes to the open air.

The heat transfer layer 150 is constructed to avoid the wiring 140, the electrode pad 111 on the electronic component 110, and the terminal 122 of the electronic component 120 to thus prevent short-circuits in the wiring 140.

Although not shown in FIG. 1A and FIG. 1B, the electronic device 100 preferably is further provided with an insulating protective film (resist) that covers the wiring 140 in order to shield the wiring 140 from open air. Thus configured, the wiring 140 is prevented from oxidation and corrosion.

However, an insulating protective film is not formed on the heat transfer layer 150. The heat transfer layer 150 is able to maintain heat dissipation efficiency by being in contact with the open air.

Manufacturing the Electronic Device

Figure 2:
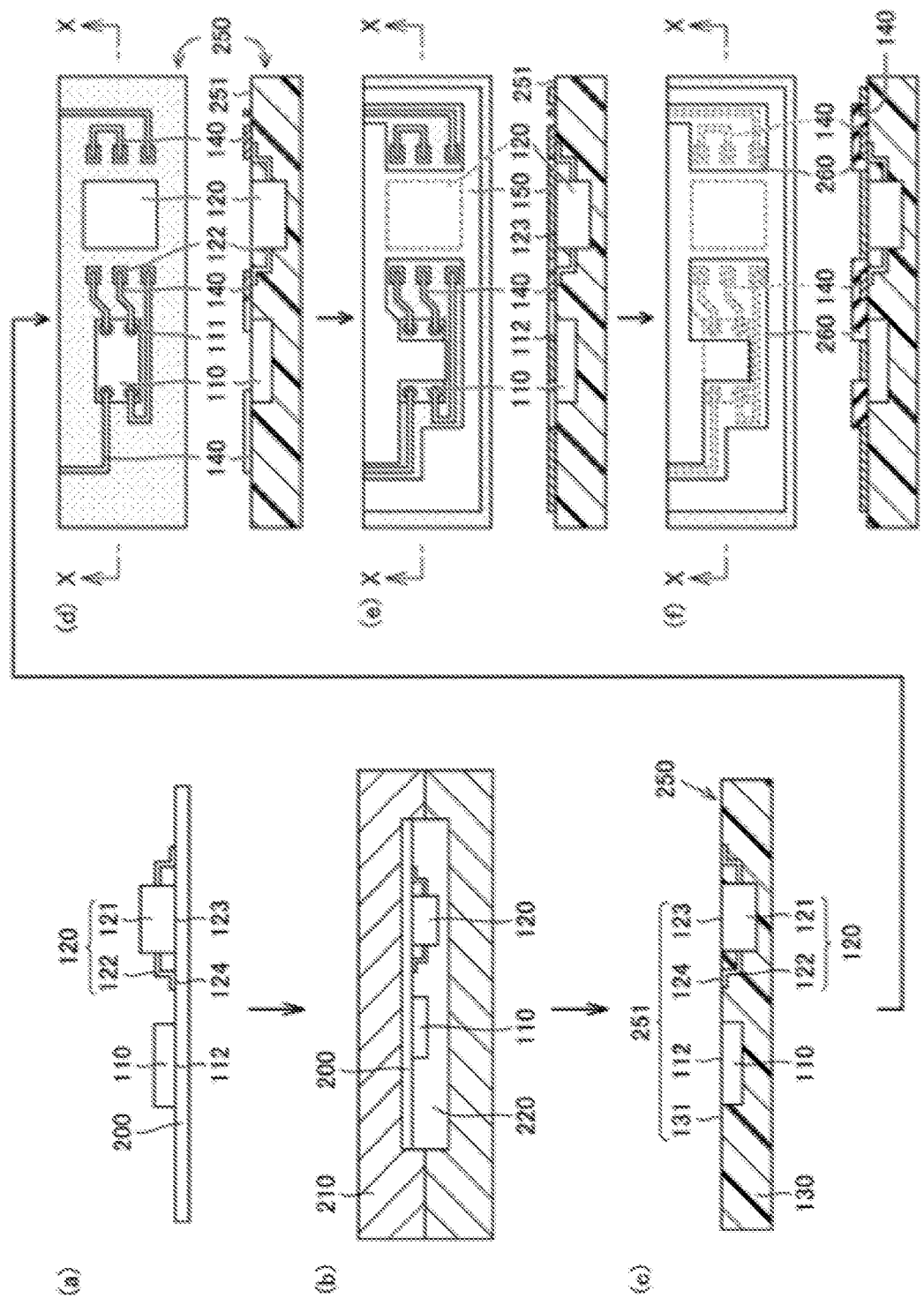
FIG. 2 is for describing one example of a method of manufacturing the electronic device according to the first embodiment.

FIG. 2 is for describing one example of a method of manufacturing the electronic device 100 according to the first embodiment; FIG. 2(*a*) through 2(*c*) are cross-sectional views for describing Step 1 through Step 3, respectively, for manufacturing the electronic device 100. FIG. 2(*d*) through 2(*f*) are for describing Step 4 through Step 6 of manufacturing the electronic device 100, where the upper part is the plan view, and the lower part is a cross-sectional view along the line X-X.

Step 1

As illustrated in FIG. 2(*a*), first, the electronic components 110, 120 are temporarily secured by pasting the electronic components to a temporary fixing sheet 200 with an adhesive (not shown). At this point, the electronic component 110 is pasted so that the surface 112 on which the electrode pad 111 is formed (FIG. 1A) is in contact with the temporary fixing sheet 200. The electronic component 120 is also pasted so that the surface 123 of the main package 121 and the end surface 124 of the terminal 122 are in contact with the temporary fixing sheet 200.

Materials such as polyethylene terephthalate (PET), polyethylene naphthalate (PEN), polyphenylene sulfide (PPS), or the like may be used for the temporary fixing sheet 200. For reasons later described, the temporary fixing sheet 200 preferably transmits ultraviolet light and is made of flexible material.

Temporary fixing involves coating one surface of the temporary fixing sheet 200 with, for instance, an ultraviolet curable adhesive (not shown) In using the temporary fixing sheet 200. For example, a temporary fixing sheet 200 made of all PET with a thickness of 50 μm may be coated with an ultraviolet curable adhesive of 2 to 3 μm thickness. This coating may be performed using a method such as ink jet printing or the like. Subsequently, the electronic components 110, 120 are positioned and placed. The temporary fixing sheet 200 is then irradiated with an ultraviolet light at, e.g., 3000 mJ/cm||2|| from the surface not carrying the electronic components 110, 120; thus, the adhesive is cured and the electronic components 110, 120 are temporarily secured to the temporary fixing sheet 200.

Step 2

The temporary fixing sheet 200 carrying the electronic components 110, 120 temporarily secured thereto is then placed in a mold 210 as illustrated in FIG. 2(b). At this point, the temporary fixing sheet 200 is arranged in the mold so that there is a space 220 between the inner surface of the mold 210 and the surface of the temporary fixing sheet 200 whereon electronic components 110, 120 are adhered. A resin is injected into the space 220 to injection mold the resin.

The conditions for injection molding may be selected as appropriate for the resin used; for example, when using polycarbonate (PC), the PC may be injection molded at an injection temperature of 270° C. and an injection pressure of 1000 MPa. Additionally, when using acrylonitrile-butadiene-styrene (ABS), the ABS may be injection molded at an injection temperature of 180° C. and an injection pressure of 20 kgf/cm$^2$.

Various types of resin materials may be adopted for injection molding. Additionally, the conditions for injection molding are not particularly limited.

Step 3

After Step 2, a structural element 250 containing the electronic components 110, 120 and the molded resin element 130 is extracted from the mold 210, and the temporary fixing sheet 200 separated from the structural element 250 as illustrated in FIG. 2(c). Thus, the sheet bonding surface 251 that was touching the temporary fixing sheet 200 is exposed in the structural element 250.

The sheet bonding surface 251 of the structural element 250 is made up of the upper outer surface 131 of the molded resin element 130, the surface 112 on the electronic component 110, and the surface 123 of the main package 121 and the end surface 124 of the terminal 122 on the electronic component 120.

If the temporary fixing sheet 200 is a PET film, the temporary fixing sheet can be easily separated from the structural element 250 because the temporary fixing sheet deforms to a large extent due to the temperature changes during Step 2.

Step 4

After Step 3, a wiring 140 is created on the sheet bonding surface 251 of the structural element 250 to connect the electrode pad 111 on the electronic component 110 or the terminal 122 on the electronic component 120 as illustrated in FIG. 2(d). The wiring 140 may be formed by spraying a conductive material (e.g., silver ink or the like) via inkjet printing, using an aerosol, or using a dispenser, or the like.

The wiring 140 may be very easily and flexibly formed using the appropriate method, to allow the electronic components 110, 120 to be electrically connected easily and conveniently electrically connected without solder connections or the like. More concretely, in terms of a work process, once the position of the electronic components 110, 120 are determined the electronic components 110, 120 can be electrically connected more accurately and easily to perform hardwiring than when, for instance, the electronic components must be positioned on the printed substrate.

Step 5

A heat transfer layer 150 is then formed on the sheet bonding surface 251 while avoiding the wiring 140, the electrode pad 111 on the electronic component 110, and the terminal 122 on the electronic component 120 as illustrated in FIG. 2(e). At this point, the heat transfer layer 150 is formed on the surface 112 and the surface 123 of the electronic components 110 and 120.

The heat transfer layer 150 may be formed by spraying a material with high thermal conductivity using inkjet printing (e.g., silver ink, or the like, with a thermal conductivity of 430 W/mK). The heat transfer layer 150 may be roughly 1-5 μm thick; however, the thickness of the heat transfer layer is not limited.

Step 4 and Step 5 may be performed at the same time if the heat transfer layer 150 uses the same material used for the wiring 140 (e.g., silver ink). That is, the regions on which the heat transfer layer 150 is created and the regions on which the wiring 140 is created may both be formed via inkjet printing to spray silver ink, for example.

Step 6

Lastly, an insulating protective film 260 (resist) is formed on the wiring 140. The protective film 260 may be formed by a method such as inkjet printing but is not limited thereto. A material ink for protective film 260 may be selectively ejected onto the wiring 140 to facilitate forming the protective film when the inkjet printing method is used.

Modification Example

From the above description, a heat transfer layer 150 is then formed in Step 5 while avoiding the wiring 140, and the electrode pad 111 on the electronic component 110 and the terminal 122 on the electronic component 120. However, an insulating film may be formed to cover the wiring 140, and the electrode pad 111 on the electronic component 110, and the terminal 122 on the electronic component 120 in another step after Step 4. In such a case, the heat transfer layer 150 is formed without avoiding the wiring 140, and the electrode pad 111 on the electronic component 110 and the terminal 122 on the electronic component 120. As a result, it is more simple to form the heat transfer layer 150.

Advantages

As above described, the electronic device 100 includes electronic components 110, 120, a molded resin element 130 wherein the electronic components 110, 120 are embedded and secured, and a heat transfer layer 150; the heat transfer layer 150 has a higher thermal conductivity than the molded resin element 130. The heat transfer layer 150 is in contact with portions of the electronic components 110, 120 other than the electrode pad 111 and the terminal 122. The configuration thus provides the following effects, (1) through (4).

(1) The heat transfer layer 150 is in direct contact with the electronic components 110, 120 with no adhesive agent or solder interposed between the heat transfer layer 150 and the electronic components 110, 120. Therefore, adhesive agents or solder which have a low thermal conductivity are not present to inhibit the conduction of heat, and the heat transfer layer 150 can efficiently conduct the heat generated in the electronic components 110, 120. The configuration thus improves the heat dissipation efficiency.

(2) With no need for complicated processing, such as creating a conduction pattern or through via in the printed substrate, or for precise alignment of the heat radiating structure and the electronic component for bonding, the cost of manufacturing can be kept low.

(3) The cost of parts can also be controlled given that a conventional printed substrate, and an adhesive is unnecessary for adhering the heat radiating structure to the electronic component.

(4) The electronic device 100 can also be made thin since a conventional printed substrate is unnecessary. Moreover, because the heat transfer layer 150 is in direct contact with the electronic components 110, 120, no adhesive agent is needed for providing a conventional heat radiating structure, and the device can be made even thinner.

The electronic component 110 contains a surface 112 that is exposed from the molded resin element 130; similarly, the electronic component 120 contains a surface 123 on the main package 121, and an end surface 124 on the terminal 122 that are exposed from the molded resin element 130. The surface 112 contains the electrode pad 111, and the end surface 124 is a portion of the terminal 122 that is the electrode for the electronic component 120. The molded resin element 130 includes an upper outer surface 131 that is connected to the surface 112, the surface 123, and the end surface 124. The electronic device 100 is provided with a wiring 140 formed on the surface 112, the surface 123, the end surface 124, and the upper outer surface 131; the wiring connects to the electrode pad 111 or the terminal 122. The heat transfer layer 150 is formed on the surface 112, the surface 123, and the upper outer surface 131 while avoiding the wiring 140, the electrode pad 111, and the terminal 122.

Figure 9:
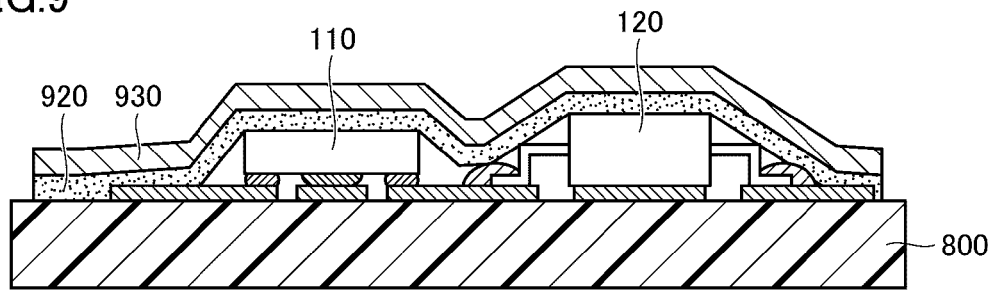
FIG. 9 is a cross-sectional view illustrating another example of an existing electronic device.

In the case of the conventional electronic device illustrated in FIG. 9, a gap exists between the electronic components 110, 120 and the highly thermally conductive resin sheet 920 because the electronic components 110, 120 protrude from the top of the printed substrate 800.

In contrast, with the above-mentioned configuration, the heat transfer layer 150 is formed on a continuous surface (i.e., a surface with small irregularities); therefore, the electronic components 110, 120 and the heat transfer layer 150 can be stuck together. Thus, the heat dissipation efficiency further improves.

Second Embodiment

An electronic device according to a second embodiment of the present invention is described below. In the first embodiment, the electronic device 100 is provided with a metallic heat transfer layer 150 which has excellent thermal conduction properties. In contrast, the electronic device according to the second embodiment is provided with an electrically insulating heat transfer layer.

Figure 3A:
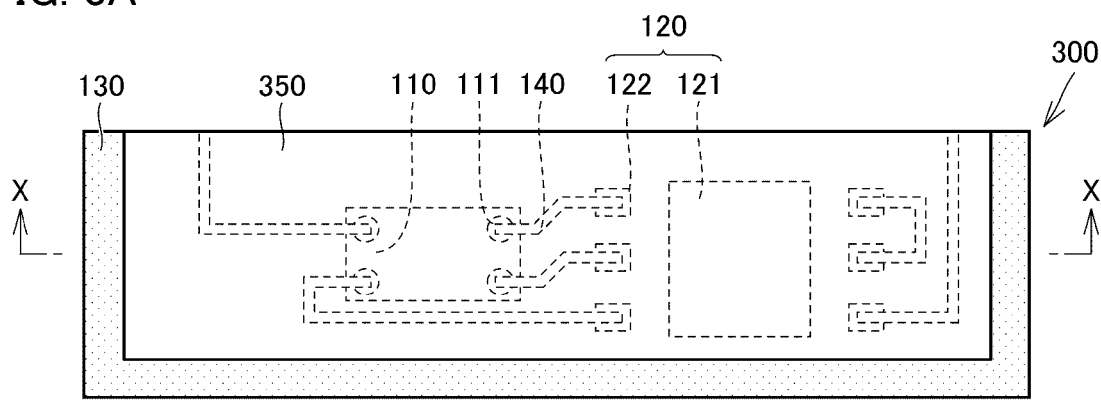
FIG. 3A is a plan view outlining a configuration of an electronic device according to a second embodiment.
Figure 3B:
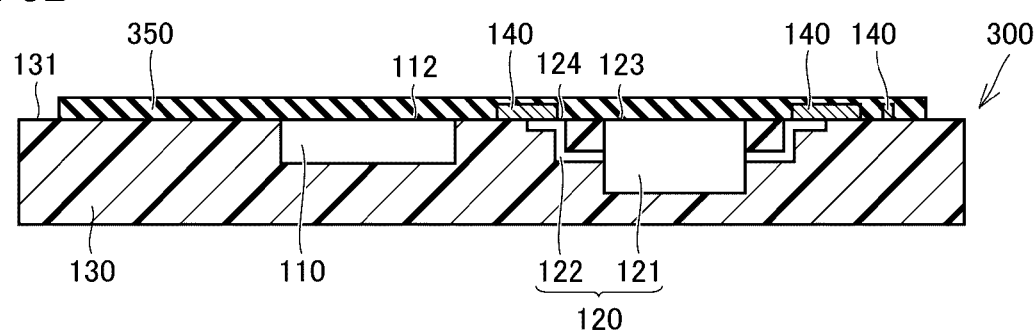
FIG. 3B is a cross-sectional view along the line X-X in FIG. 3A.

FIG. 3A is a plan view outlining a configuration of an electronic device 300 according to a second embodiment; and FIG. 3B is a cross-sectional view along the line X-X in FIG. 3A.

The electronic device 300 is provided with the heat transfer layer 350 as illustrated in FIG. 3A and FIG. 3B, instead of the heat transfer layer 150 in the electronic device 100 illustrated in FIG. 1A and FIG. 1B.

The heat transfer layer 350 is an electrically insulating element with better thermal conduction properties than the molded resin element 130. The heat transfer layer 350 may be made up of non-conductive graphite with a thermal conductivity of 100 W/mK.

The same methods used to form the heat transfer layer 150 in the first embodiment may be used to form the heat transfer layer 350. However, given that the heat transfer layer 350 is an electrically insulating element, there is no need to selectively place the material in areas with none of the electrode pad 111, and the terminal 122 and the wiring 140 as in the first embodiment. Therefore, the heat transfer layer 350 may be formed on surface 112 on the electronic component 110, the surface 123 of the main package 121 and the end surface 124 of the terminal 122 on the electronic component 120, and substantially the entire upper outer surface 131 of the molded resin element 130 to thereby cover the wiring 140. Hereby, it is more simple to form the heat transfer layer 350.

There is also no need to provide a separate protective film because the heat transfer layer 350 also serves to protect the wiring 140 from open air.

The electronic device 300 according to the second embodiment may be manufactured by performing Step 1 through Step 4 described in the first embodiment (FIG. 2(*a*) through 2(*d*)), whereafter the heat transfer layer 350 is formed over substantially the entire sheet bonding surface 251 on the structural element 250 (FIG. 2(*d*)) instead of performing Step 5 and Step 6 described above. At this point the heat transfer layer 350 is formed covering the wiring 140 since an electrically insulating element serves as the heat transfer layer 350. Hereby, it is more simple to form the heat transfer layer 350.

Third Embodiment

An electronic device according to a third embodiment of the present invention is described below. In the first embodiment described above, only one surface of the electronic components 110, 120 is exposed from the molded resin element 130. Whereas, a plurality of surfaces on the electronic components 110, 120 is exposed from the molded resin element and a heat transfer layer is present on each of said surfaces in an electronic device according to the third embodiment.

Figure 4A:
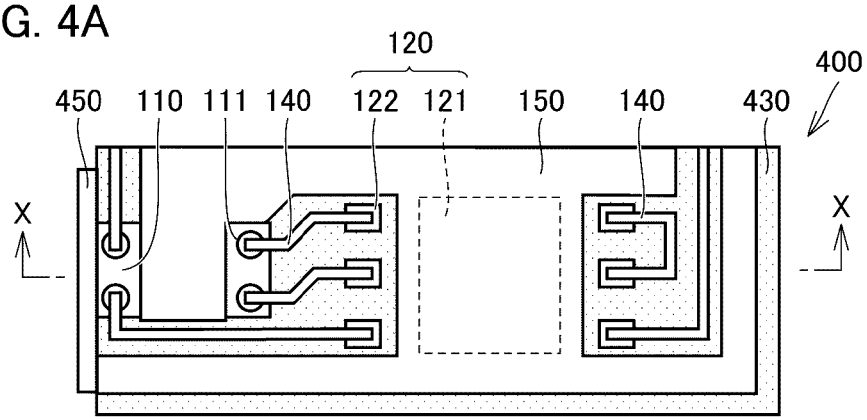
FIG. 4A is a plan view outlining configuration of an electronic device according to a third embodiment.
Figure 4B:
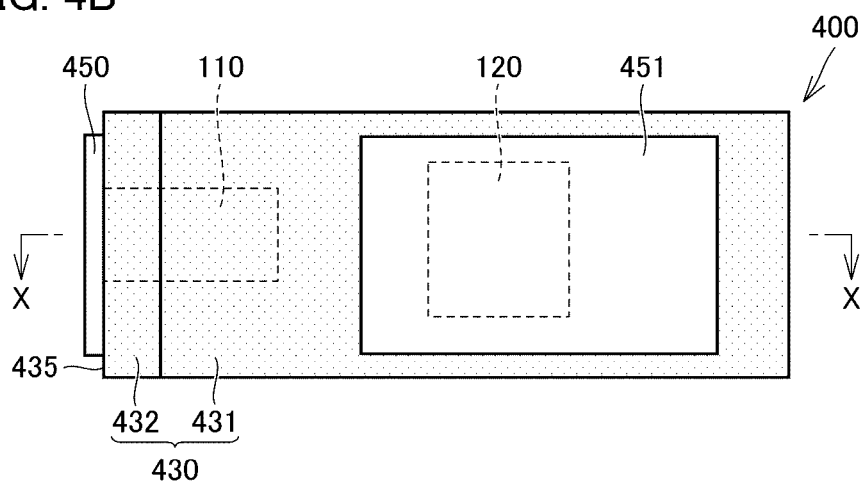
FIG. 4B is a bottom view outlining configuration of an electronic device according to a third embodiment.

FIG. 4A is a (top) plan view outlining configuration of an electronic device 400 according to a third embodiment; FIG. 4B is a bottom view outlining configuration of the electronic device 400; and FIG. 4C is a cross-sectional view along the line X-X in FIG. 4A and FIG. 4B.

Figure 4C:
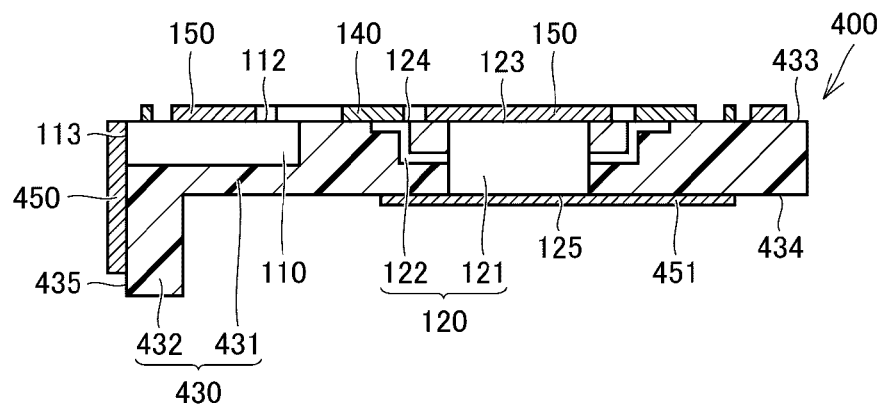
FIG. 4C is a cross-sectional view along the line X-X in FIG. 4A.

The electronic device 400 is provided with a molded resin element 430, as illustrated in FIG. 4A, FIG. 4B, and FIG. 4C, instead of the molded resin element 130 in the electronic device 100 illustrated in FIG. 1A and FIG. 1B. In addition to the heat transfer layer 150, the electronic device 400 is also provided with heat transfer layers 450, 451.

The molded resin element 430 has an L-shaped cross section and contains a flat portion 431, and a pendent portion 432 that extends downward from an end of the flat portion 431. The thickness of the flat portion 431 is roughly the same as the height (thickness) of the electronic component 120.

The electronic component 110 is embedded in the flat portion 431 of the molded resin element 430 in the corner created by the upper outer surface 433 and the side surface 435 of the pendent portion 432.

The electrode pad 111, which creates the surface 112 on the electronic component 110, is an exposed surface similar to that of the first embodiment and is exposed from the upper outer surface 433 of the molded resin element 430 (and more specifically, from the flat portion 431). Moreover, in the third embodiment, the surface 113 adjacent to the surface 112 is also an exposed surface which is exposed from the side surface 435 of the molded resin element 430 (and more specifically, from the pendent portion 432).

Because the electronic component 120 is substantially the same height as the thickness of the flat portion 431 when embedded, the two mutually facing surfaces of the electronic component 120 are exposed from the flat portion 431. More specifically, similarly to the first embodiment, the surface 123 which is flush with the end surface 124 of the terminal 122 on the electronic component 120 is an exposed surface that is exposed from the upper outer surface 433 of the molded resin element 430 (and more specifically, from the flat portion 431). Moreover, in the third embodiment, the surface 125, which faces the surface 123, is also an exposed surface that is exposed from the lower outer surface 434 of the molded resin element 430 (and more specifically, from the flat portion 431).

Similar to the first embodiment, the upper outer surface 433 of the flat portion 431 of the molded resin element 430, the surface 112 on the electronic component 110, and the surface 123 of the main package 121 and end surface 124 of the terminal 122 on the electronic component 120 are flush. That is, the upper outer surface 433 of the flat portion 431 is a continuous outer surface that continues from the surface 112 of the electronic component 110 and continues from the surface 123 and the end surface 124 of the terminal 122 on the main package 121 of the electronic component 120.

Additionally, the side surface 435 on the pendent portion 432 of the molded resin element 430 is flush with the surface 113 of the electronic component 110 in the third embodiment. That is, the side surface 435 of the pendent portion 432 is a continuous outer surface that continues from the surface 113 of the electronic component 110.

The lower outer surface 434 on the flat portion 431 of the molded resin element 430 is flush with the surface 125 of the electronic component 120. That is, the lower outer surface 434 of the flat portion 431 is a continuous outer surface that continues from the surface 125 of the electronic component 120.

The heat transfer layer 450 is formed on the surface 113 of the electronic component 110 and the side surface 435 of the pendent portion 432.

The heat transfer layer 451 is formed on the surface 125 of the electronic component 120 and on the lower outer surface 434 of the flat portion 431.

Similar to the first embodiment, the wiring 140 is formed on the upper outer surface 433 of the flat portion 431 and connects to the electrode pad 111 of the electronic component 110 and the terminal 122 of the electronic component 120. The heat transfer layer 150 is also formed on the upper outer surface 433 of the flat portion 431, and on the surface 112 and the surface 123 of the electronic components 110 and 120 similarly to the first embodiment. However, the pattern of the wiring 140 in the heat transfer layer 150 coincides with the shape of the flat portion 431 and may be modified from the pattern.

The electronic device 400 may be manufactured using the same processes used to manufacture the electronic device 100 of the first embodiment. However, a mold with an L-shaped cavity is used and the temporary fixing sheet 200 (FIG. 2(a)) is placed in the mold so that the surface 112 of the electronic component 110 and the surface 123 of the electronic component 120 are in contact with the inner surface of the mold.

According to the third embodiment, a plurality of surfaces 112, 113, 123, 125 on the electronic components 110, 120 is exposed from the molded resin element 430 and a heat transfer layer is present on each of said surfaces 112, 113, 123, 125. Thus, the heat generated by the electronic components 110, 120 may be efficiently dissipated.

Fourth Embodiment

An electronic device according to a fourth embodiment of the present invention is described below. In the above-described first embodiment, the heat transfer layer 150 is formed on the outer surface of the electronic components 110, 120 which are exposed from the molded resin element 130. Whereas, in an electronic device according to the fourth embodiment, the heat transfer layer is embedded in the molded resin element with the electronic device electronic components; moreover, the heat transfer layer is interposed between the electronic components and the molded resin element.

Electronic Device Configuration

Figure 5A:
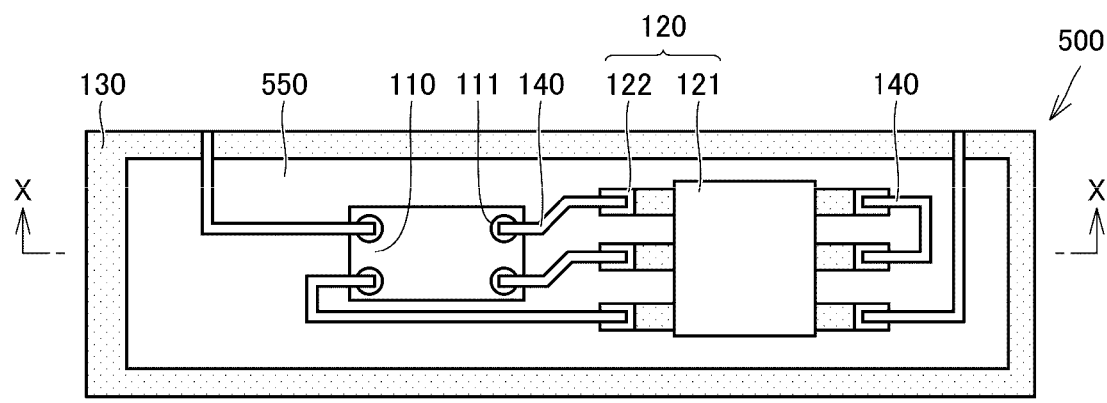
FIG. 5A is a plan view outlining a configuration of an electronic device according to a fourth embodiment.
Figure 5B:
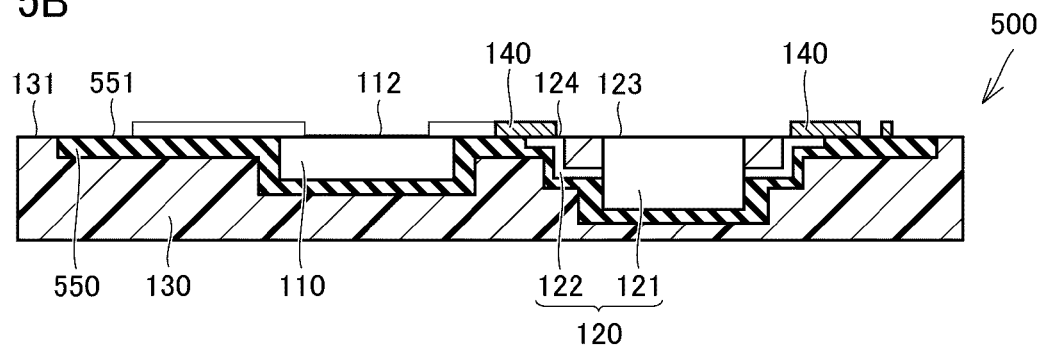
FIG. 5B is a cross-sectional view along the line X-X in FIG. 5A.

FIG. 5A is a plan view outlining a configuration of an electronic device 500 according to a fourth embodiment; FIG. 5B is a cross-sectional view along the line X-X in FIG. 5A.

The electronic device 500 is provided with the heat transfer layer 550 as illustrated in FIG. 5A and FIG. 5B, instead of the heat transfer layer 150 in the electronic device 100 illustrated in FIG. 1A and FIG. 1B.

A portion of the heat transfer layer 550 is provided between the electronic components 110, 120 and the molded resin element 130; the heat transfer layer 550 is embedded along with the electronic components 110, 120 into the molded resin element 130.

The remainder of the heat transfer layer 550 is formed along the outer surface of the molded resin element 130 around the electronic components 110, 120 and is exposed from the molded resin element 130. The upper outer surface 551, which is the portion of the molded resin element 130 that is exposed, is flush with the surface 112 of the electronic component 110, and the surface 123 of the main package 121 and the end surface 124 of the terminal 122 on the electronic component 120 in the heat transfer layer 550. That is, the upper outer surface 551 connects the surface 112, the surface 123, and the end surface 124.

The upper outer surface 551 of the heat transfer layer 550 is flush with the upper outer surface 131 of the molded resin element 130 and connects therewith.

The heat transfer layer 550 is an electrically insulating element with better thermal conduction properties than the molded resin element 130. The heat transfer layer 550 may be made up of non-conductive graphite with a thermal conductivity of 100 W/mK.

The wiring 140 is formed on the electronic components 110, 120, the heat transfer layer 550, and the outer surface of the molded resin element 130; the wiring 140 connects the electrode pad 111 of the electronic component 110 and the terminal 122 of the electronic component 120.

The upper outer surface 551 of the heat transfer layer 550, the surface 112 of the electronic component 110, the surface 123 and the end surface 124 of the terminal 122 on the electronic component 120, and the upper outer surface 131 of the molded resin element 130 are continuous in the electronic device 500. Therefore, the wiring 140 may be easily produced by, for instance, using an inkjet printer to print silver ink (Ag).

Manufacturing the Electronic Device

Figure 6:
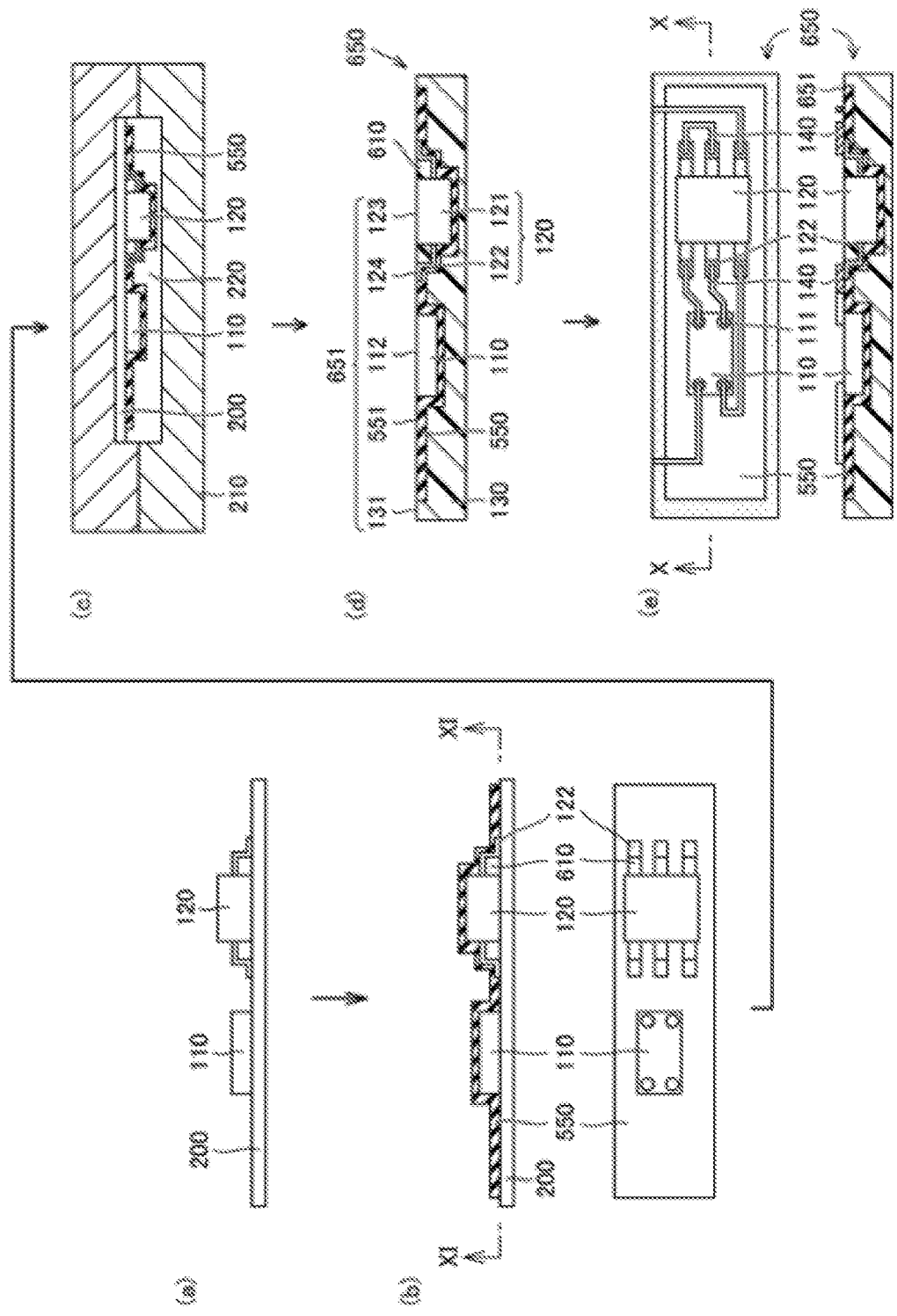
FIG. 6 is for describing one example of a method of manufacturing the electronic device according to the fourth embodiment.
Figure 7:
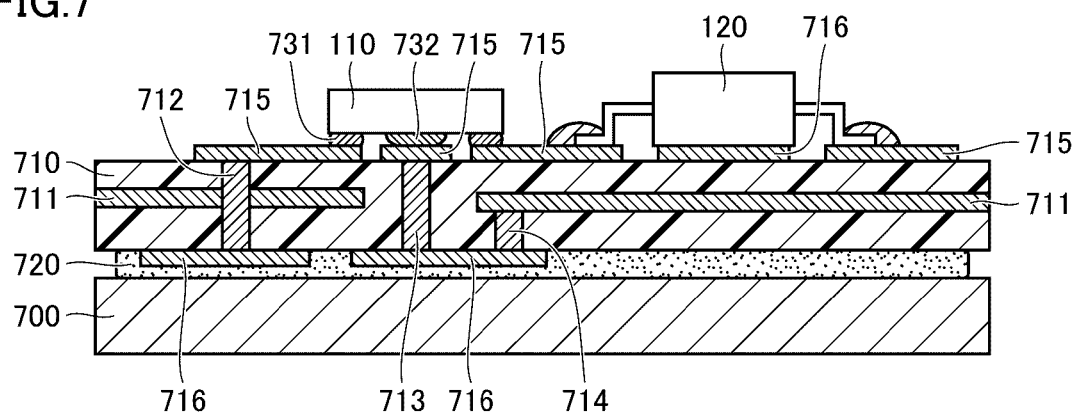
FIG. 7 is a cross-sectional view illustrating one example of an electronic device provided with a printed substrate that possesses a conventional heat radiating structure.
Figure 8:
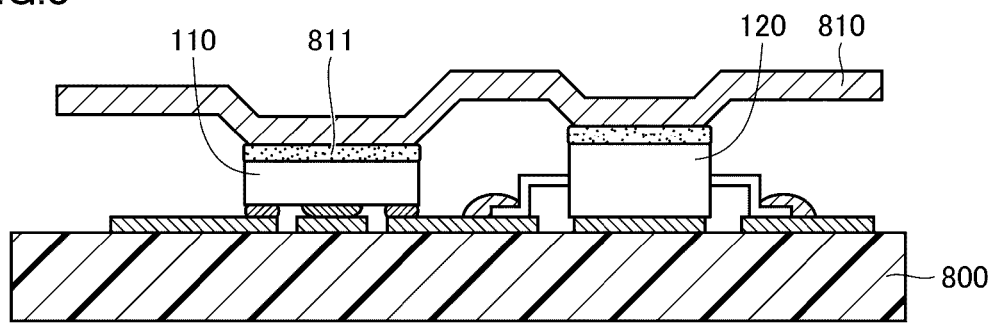
FIG. 8 is a cross-sectional view illustrating one example of an existing electronic device.

FIG. 6 is for describing one example of a method of manufacturing the electronic device 500 according to the fourth embodiment; FIG. 6(a) is a cross-sectional view for describing Step 1 of manufacturing the electronic device 500; FIG. 6(b) is for describing Step 2 of manufacturing the electronic device 500; the upper part is the plan view, and the lower part a cross-sectional view along the line XI-XI; FIG. 6(c) is a cross-sectional view for describing Step 3 of manufacturing the electronic device 500; FIG. 6(d) is a cross-sectional view for describing Step 4 of manufacturing the electronic device 500; and FIG. 6(e) is for describing Step 5 of manufacturing the electronic device 500 where the upper part is the plan view, and the lower part is a cross-sectional view along the line X-X.

Step 1

As illustrated in FIG. 6(a), first, the electronic components 110, 120 are temporarily secured by pasting the electronic components to a temporary fixing sheet 200 with an adhesive (not shown). Given this process is identical to Step 1 described in the first embodiment, further descriptions are omitted.

Step 2

Next, a heat transfer layer 550 is laminated onto the surface of the temporary fixing sheet 200 carrying the electronic components 110, 120 temporarily secured thereto at least on and surrounding the electronic components 110, 120 as illustrated in FIG. 6(b). The heat transfer layer 550 may be laminated by using a method such as inkjet printing to spray an ink component made of a material that is highly thermally conductive and electrically insulating, e.g., non-conducting graphite, or the like, which has a thermal conductivity of 100 W/mK. The heat transfer layer 550 may be roughly 5-10 μm thick; however, the thickness of the heat transfer layer is not limited.

Because the heat transfer layer 550 is an electrically insulating element, the heat transfer layer 550 may be selectively formed on and surrounding only the electronic components 110, 120; alternatively, the heat transfer layer 550 may be formed on almost the entire surface of the temporary fixing sheet 200 whereon the electronic components 110, 120 are temporarily secured. Manufacturing cost can be controlled since the pattern forming the heat transfer layer 550 does not require a detail design when the heat transfer layer 550 is provided over substantially the entire surface of the temporary fixing sheet 200 whereon the electronic components 110, 120 are temporarily secured.

Inkjet printing may be used to form the heat transfer layer 550 on an electronic component 120 that contains a quad flat package (QFP) type terminal 122. However, no grave issues arise in terms of heat dissipation efficiency even though there are areas surrounded by the terminal 122 and the temporary fixing sheet 200 that do not have the heat transfer layer 550.

Step 3

The temporary fixing sheet 200 carrying the electronic components 110, 120 temporarily secured thereto is placed in a mold 210 as illustrated in FIG. 6(c). A resin is injected into the space 220 between the temporary fixing sheet and the inner surface of the mold 210 to injection mold the resin. Given this process is identical to Step 2 described in the first embodiment, further descriptions are omitted.

Step 4

After Step 3, a structural element 650 containing the electronic components 110, 120, the heat transfer layer 550, and the molded resin element 130 is extracted from the mold 210, and the temporary fixing sheet 200 separated from the structural element 650 as illustrated in FIG. 6(d). Thus, a sheet bonding surface 651 that was touching the temporary fixing sheet 200 is exposed in the structural element 650.

The sheet bonding surface 651 of the structural element 650 is made up of the upper outer surface 131 of the molded resin element 130, the upper outer surface 551 of the heat transfer layer 550, the surface 112 of the electronic component 110, and the surface 123 of the main package 121 and the end surface 124 of the terminal 122 on the electronic component 120.

The molded resin element 130 fills into the area 610 surrounded by the terminal 122 on the electronic component 120 and the temporary fixing sheet 200 as illustrated in FIG. 6(d).

Step 5

After Step 4, a wiring 140 is created on the sheet bonding surface 651 of the structural element 650 to connect the electrode pad 111 on the electronic component 110 or the terminal 122 on the electronic component 120 as illustrated in FIG. 6(e). Given this process is identical to Step 4 described in the first embodiment, further descriptions are omitted.

Modification Example

Similar to the first embodiment, a heat transfer layer 150 may be formed in the fourth embodiment on the sheet bonding surface 651 of the structural element 650 while avoiding the wiring 140. Alternatively, similar to the second embodiment, an electrically insulating heat transfer layer 350 may be formed on almost the entire sheet bonding surface 651 (in the areas including the wiring 140). Thus, the heat generated by the electronic components 110, 120 may be efficiently dissipated.

Additionally, after Step 5, Step 6 of the first embodiment may be performed to create an insulating protective film on the electrode pad 111 of the electronic component 110, and the terminal 122 and the wiring 140 of the electronic component 120.

Advantages

The heat transfer layer 550 is embedded in the molded resin element 130 along with the electronic components 110, 120 in the electronic device 500 of the fourth embodiment; therefore, this allows for a thin electronic device 500.

Similar to the first embodiment, the heat transfer layer 550 is in direct contact with the electronic components 110, 120 with no adhesive agent or solder interposed between the heat transfer layer 550 and the electronic components 110, 120. Therefore, adhesive agents or solder which have a low thermal conductivity are not present to inhibit the conduction of heat, and this improves the heat dissipation efficiency.

Finally, similar to the first embodiment, the cost of parts and manufacturing can be controlled given that there is no need for the conventional printed substrate with its complicated processing, or the adhesive agent for bonding the heat radiating structure to the electronic component.

All aspects of the embodiments disclosed should be considered merely examples and not limitations as such. The scope of the present invention is not limited to the above description but to the scope of the claims which is intended to include all equivalents and modifications allowable thereby.

REFERENCE NUMERALS 100,300,400,500 Electronic device
110,120 Electronic component
111 Electrode pad
112,113,123,125 Surface
121 Main component
122 Terminal
124 End surface 130,430 Molded resin element
131,433,551 Upper outer surface
140 Wiring
150,350,450,451,550 Heat transfer layer
200 Temporary fixing sheet
210 Mold
220 Space
250,650 Structural element
251,651 Sheet bonding surface
260 Protective film
431 Flat portion
432 Pendent portion
434 Lower outer surface
435 Side surface
610 Area

The invention claimed is:
1. An electronic device comprising:
an electronic component;
a molded resin sheet into which the electronic component is embedded and secured;
wiring configured to connect to an electrode of the electronic component; and
a heat transfer layer that is more thermally conductive than the molded resin sheet, and touching the electronic component, wherein
the electronic component and the heat transfer layer are embedded and secured in the molded resin sheet,
an outer surface of the electronic component comprises a first surface that is exposed from the molded resin sheet and a second surface that faces the molded resin sheet,
a portion of the first surface comprises an outer surface of the electrode,
a first portion of the heat transfer layer is formed between the molded resin sheet and the second surface,
a second portion of the heat transfer layer is formed along an outer surface of the molded resin sheet around the electronic component, and exposed from the molded resin sheet, and
the wiring is formed on the first surface and an outer surface of the heat transfer layer.

* * * * *